(12) United States Patent
Espinoza et al.

(10) Patent No.: US 7,952,945 B2
(45) Date of Patent: May 31, 2011

(54) METHOD AND APPARATUS FOR DETERMINING WRITE LEVELING DELAY FOR MEMORY INTERFACES

(75) Inventors: Anne Espinoza, Austin, TX (US); John MacLaren, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 235 days.

(21) Appl. No.: 12/414,044

(22) Filed: Mar. 30, 2009

(65) Prior Publication Data
US 2010/0246291 A1 Sep. 30, 2010

(51) Int. Cl.
*G11C 7/00* (2006.01)
*G11C 8/18* (2006.01)

(52) U.S. Cl. ............... 365/194; 365/193; 365/233.1; 365/233.13

(58) Field of Classification Search .............. None
See application file for complete search history.

(56) References Cited

U.S. PATENT DOCUMENTS

2009/0077411 A1* 3/2009 Tokuhiro ............... 713/601
2009/0129179 A1* 5/2009 Yamazaki ............... 365/194

* cited by examiner

*Primary Examiner* — Huan Hoang
*Assistant Examiner* — James G Norman
(74) *Attorney, Agent, or Firm* — Patent Venture Group; Joe A. Brock, II

(57) ABSTRACT

An invention is provided for determining write leveling delay for a plurality of memory devices having command signals lines connected in series to each memory device is disclosed. The invention includes determining a device delay value for each memory device. Each device delay value indicates a period of time to delay a DQS signal when accessing a related memory device. Once these delay values are determined, the delay values are examined sequentially and a prior device delay value is set to a lower value, for example zero, when a subsequent device delay value of a memory device connected subsequently along the command signal lines is greater than the prior device delay value.

20 Claims, 10 Drawing Sheets

METHOD AND APPARATUS FOR DETERMINING WRITE LEVELING DELAY FOR MEMORY INTERFACES

BACKGROUND OF THE INVENTION

1. Field of the Invention

This invention relates generally to random access memory, and more particularly to write leveling delay determination for memory interfaces.

2. Description of the Related Art

Double data rate (DDR) synchronous dynamic random access memory (SDRAM) is a class of memory capable of providing approximately twice the bandwidth of single data rate SDRAM. DDR SDRAM achieves this increased bandwidth without requiring an increased clock frequency by transferring data on both the rising and falling edges of the clock signal. Because the increased bandwidth, DDR SDRAM often is used in the design of integrated circuits.

DDR SDRAM integrated circuits often are used in dual in-line memory modules (DIMMs) for use in a computer system. A typical DIMM includes a plurality of DDR SDRAM integrated circuits mounted on a printed circuit board for use in a personal computer system, workstation, or server. DIMMs include inputs for clock and command signals as well as input/ouput (I/O) interfaces for data, both of which are designed to work together to write and read data from the individual DDR SDRAM integrated circuits.

FIG. 1 is a block diagram showing a prior art DDR DIMM 100 architecture using DDR SDRAM integrated circuit devices. As illustrated in FIG. 1, the DDR DIMM 100 includes a plurality of DDR memory devices 102a-102h disposed on a printed circuit board 104. Coupled to each DDR memory device 102a-102h is a set of data/data strobe signal (DQS) lines 106. Each set of data/DQS lines 106 provide I/O for each DDR memory devices 102a-102h. As will be appreciated by those skilled in the art, DDR memory devices require separate control lines that are unique to each memory device and distributed in parallel. These parallel control lines are known as data strobe signal (DQS) lines and are generated from a differential clock fed to each DDR memory device 102a-102h and a DLL located within each DDR memory device 102a-102h. The DQS signal allows each DDR memory device 102a-102h to launch data from the memory device at the same instant as a data-valid signal is needed. Also included in the DDR DIMM 100 are clock and command signal lines 108, which provide clock and command signals to each of the DDR memory devices 102a-102h.

As illustrated in FIG. 1, the clock and command signal lines 108 are connected to each DDR memory device 102a-102h on the DDR DIMM 100 in a parallel configuration. That is, the clock and command signal lines 108 are provided to each DDR memory device 102a-102h simultaneously. In this manner, each DDR memory device 102a-102h provides or receives data to/from its associated data/DQS lines 106 at approximately the same time. For example, in FIG. 1 each DDR memory device 102a-102h provides eight bits of a 64 byte read request in response to receiving a read command on the clock and command lines 108 at approximately the same time, allowing a memory controller to fetch 64 bits of data using a single read command.

However, with increased user needs in the form of speed and performance, more advanced memory circuits have been developed. One such advance is double data rate three (DDR3) SDRAM. DDR3 SDRAM is an improvement over DDR SDRAM that allows input/output (I/O) transfer at about eight times the speed of the memory cells contained in the DDR SDRAM. Moreover, DDR3 requires less power to operate than normal DDR SDRAM. However, to accommodate the newer DDR3 SDRAM integrated circuits, a new DIMM architecture was developed that changes the manner in which off-board clock and command signals are provided to the individual DDR3 SDRAM integrated circuits located on the DIMM, as illustrated next with reference to FIG. 2.

FIG. 2 is a block diagram showing a prior art DDR3 DIMM 200 architecture using DDR3 SDRAM integrated circuit devices. As illustrated in FIG. 2, the DDR3 DIMM 200 includes a plurality of DDR3 memory devices 202a-202h disposed on a printed circuit board 204. Coupled to each DDR3 memory device 202a-202h is a set of data/DQS lines 206, which provide I/O for each DDR3 memory devices 202a-202h. Also included in the DDR3 DIMM 200 are clock and command signal lines 208, which provide clock and command signals to each of the DDR3 memory devices 202a-202h.

However, unlike the DDR DIMM 100 illustrated in FIG. 1, the DDR3 DIMM 200 is configured in a fly-by topology in which the clock and command signal lines 208 are connected in series to each DDR3 memory device 202a-202h on the DDR3 DIMM 200 in a daisy chain configuration. That is, the clock and command signal lines 208 are first provided to DDR3 memory device 202a, then to DDR3 memory device 202b, then to DDR3 memory device 202c, and so on to DDR3 memory device 202h. Consequently, DDR3 memory device 202a receives and acts on the received clock and command signals prior to DDR3 memory device 202b. Similarly, DDR3 memory device 202b receives and acts on the received clock and command signals prior to DDR3 memory device 202c, and so on until DDR3 memory device 202h receives and acts on the received clock and command signals last after DDR3 memory devices 202a-202h. This configuration reduces the number of stubs and the stub lengths, and allows termination to be placed just at the end of the clock and command signals. As a result, this design improves signal characteristics over the DDR DIMM 100 illustrated in FIG. 1.

However, as illustrated in FIG. 2, the data/DQS lines 206 are not configured in a daisy chain configuration. Hence, when a write command is provided to the DDR3 DIMM 200, each DDR3 memory device 202a-202h will see the command at a slightly different time, and as a result, will need to receive data on the data/DQS lines 206 at a slightly different time in order to align the data with the command on the DDR3 DIMM 200. Similarly, when a read command is provided to the DDR3 DIMM 200, each DDR3 memory device 202a-202h will provide the requested read data on its data/DQS lines 206 at a slightly different time.

In view of the foregoing, there is a need for systems and methods for determining proper delays to allow alignment between commands and data in a DDR3 memory interface. The methods should allow for automatic determination of the proper delay times, thus allowing a DDR3 DIMM to be properly integrated into a larger system.

SUMMARY OF THE INVENTION

Broadly speaking, embodiments of the present invention address these needs by determining provisional device delay values for each DQS signal via repeated sampling of a clock signal at each memory device. Once all provisional device delay values are calculated, the provisional device delay values are further processed to determine final delay values for DQS signals for each memory device, which may differ from the provisional device delay values. For example, in one embodiment, a method for determining write leveling delay for a plurality of memory devices having command signal lines connected in series to each memory device is disclosed. The method includes determining a device delay value for each memory device. Each device delay value indicates a period of time to delay a control signal that is unique to an associated memory device, such as a DQS signal, when accessing the associated memory device. Once these delay values are determined, the delay values are examined sequentially and a prior device delay value is set to a lower value, for example zero, when a subsequent device delay value of a memory device connected subsequently along the command signal lines is greater than the prior device delay value. In one aspect, each device delay value indicates a number of delay elements, where each delay element is a predefined period of time. To increase efficiency, one embodiment of the present invention compares each device delay value to a subsequent device delay value only once, however, it should be noted that this approach is not required.

An additional method for determining write leveling delay for a plurality of memory devices having command signal lines connected in series to each memory device is disclosed in a further embodiment of the present invention. As above, the method includes determining a device delay value for each memory device, wherein each device delay value indicates a period of time to delay a control signal that is unique to an associated memory device when accessing a related memory device. Next, a first device delay value associated with a first memory device is compared to a second device delay value associated with a second memory device, wherein the second memory device is connected in series after the first memory device. If the first delay value is greater than the second device delay value, the first device delay value is set to a lower value, such as zero. When the first device delay value is less than the second device delay value, the first device delay value can be allowed to remain unchanged. To further the example, the second device delay value can be compared to a third device delay value associated with a third memory device, which is connected in series after the second memory device. Then, as above, the second device delay value can be set to a lower value when the second device delay value is greater than the third device delay value.

In a further embodiment, a memory controller capable of performing write leveling operations is disclosed. The memory controller includes a plurality of control lines, such as DQS lines, each capable of being configured to access a memory device via a control signal, and a plurality of command signal lines capable of being placed in serial communication with each memory device. Also included is logic that determines a device delay value for each memory device, wherein each device delay value indicates a period of time to delay a control signal that is unique to associated memory device when accessing the associated memory device. Logic also is included that sets a prior device delay value to a lower value when a subsequent device delay value of a memory device connected subsequently along the command signal lines is greater than the prior device delay value. As above, each device delay value can indicate a number of delay elements, each being a predefined period of time. Generally, the device delay values can be determined by repeatedly sampling a clock signal and comparing the clock signal to the control signal. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for determining write leveling delay for memory interfaces. As will be appreciated by those skilled in the art, DDR memory devices require separate control lines that are unique to each memory device and distributed in parallel. These parallel control lines are known as data strobe signal (DQS) lines and provide control signals that are unique to the associated memory device and are generated from a differential clock fed to each DDR memory device and a DLL located within each DDR memory device. In general, embodiments of the present invention determine provisional device delay values for each DQS signal via repeated sampling of a clock signal at each memory device, and then performing further processing on the provisional delay values to refine the write leveling delay results.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

As mentioned above, the clock and command signal lines are connected in series to each memory device through a DDR3 DIMM. This configuration reduces the number of stubs and the stub lengths, and allows termination to be placed just at the end of the clock and command signals. However, the series based connections result in slight delays in command signals between the various DDR3 memory devices on the DIMM. That is, the DDR3 memory device connected first in series receives and acts on the received clock and command signals prior to the next DDR3 memory device, and so on until the last DDR3 memory device on the DIMM. This delay is known as flight time skew and is introduced by the fly-by topology of the DDR3 DIMM.

Since the data/DQS lines for each DDR3 memory device are not configured in a daisy chain configuration, the flight time skew needs to be compensated for in order to allow data on the data bus to be captured reliably. Embodiments of the present invention address this issue by determining proper delays for each data strobe (DQS) signal to allow alignment between command and data in a DDR3 memory interface. To this end, embodiments of the present invention sample a source clock signal provided to the DDR3 DIMM while the DDR3 DIMM is in write leveling mode and determine provisional DQS delays. Then, the provisional DQS delays are examined and optionally adjusted to calculate a final DQS delay for each memory device on the DIMM that aligns the particular DQS with the source clock signal at that particular memory device.

Figure 1:
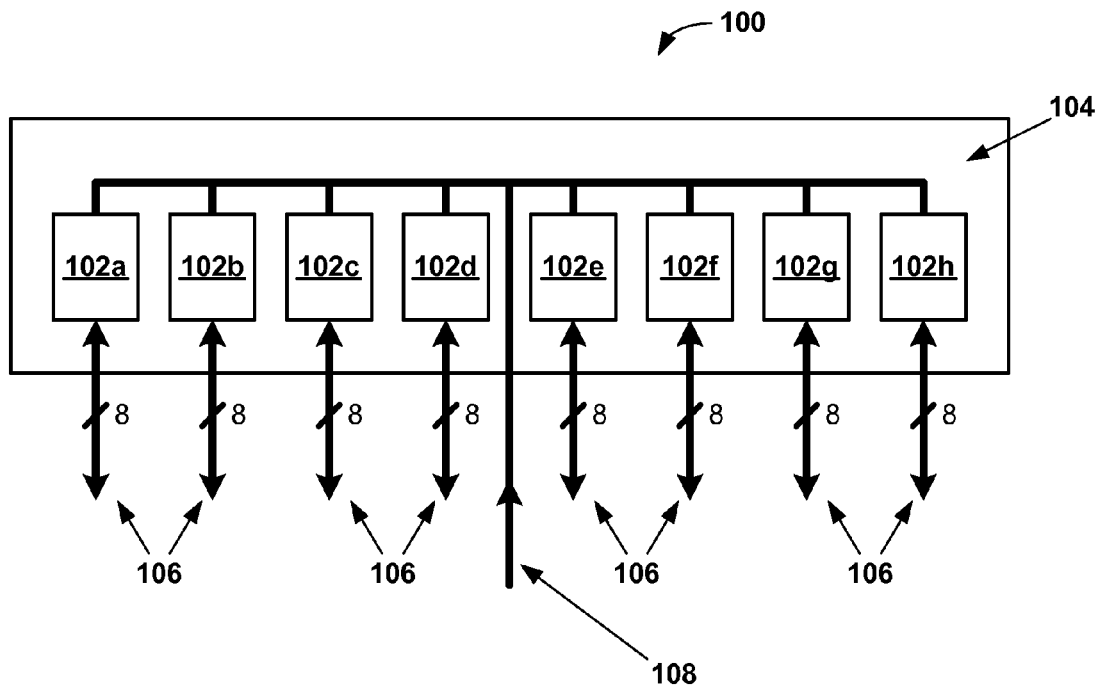
FIG. 1 is a block diagram showing a prior art DDR DIMM architecture using DDR SDRAM integrated circuit devices.
Figure 2:
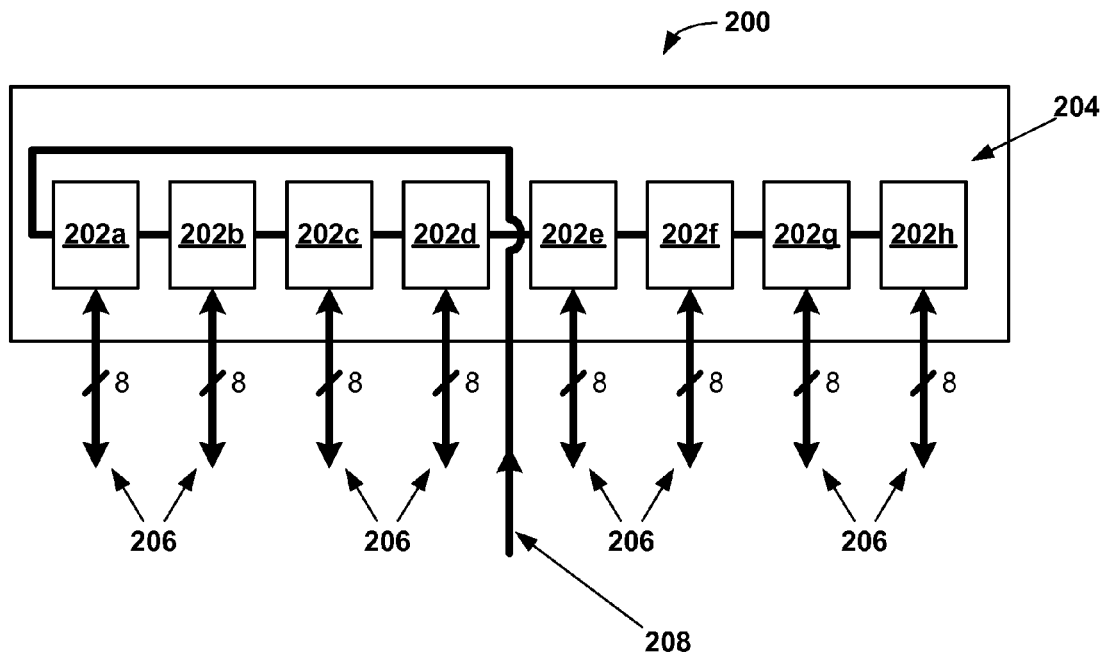
FIG. 2 is a block diagram showing a prior art DDR3 DIMM architecture using DDR3 SDRAM integrated circuit devices.
Figure 3:
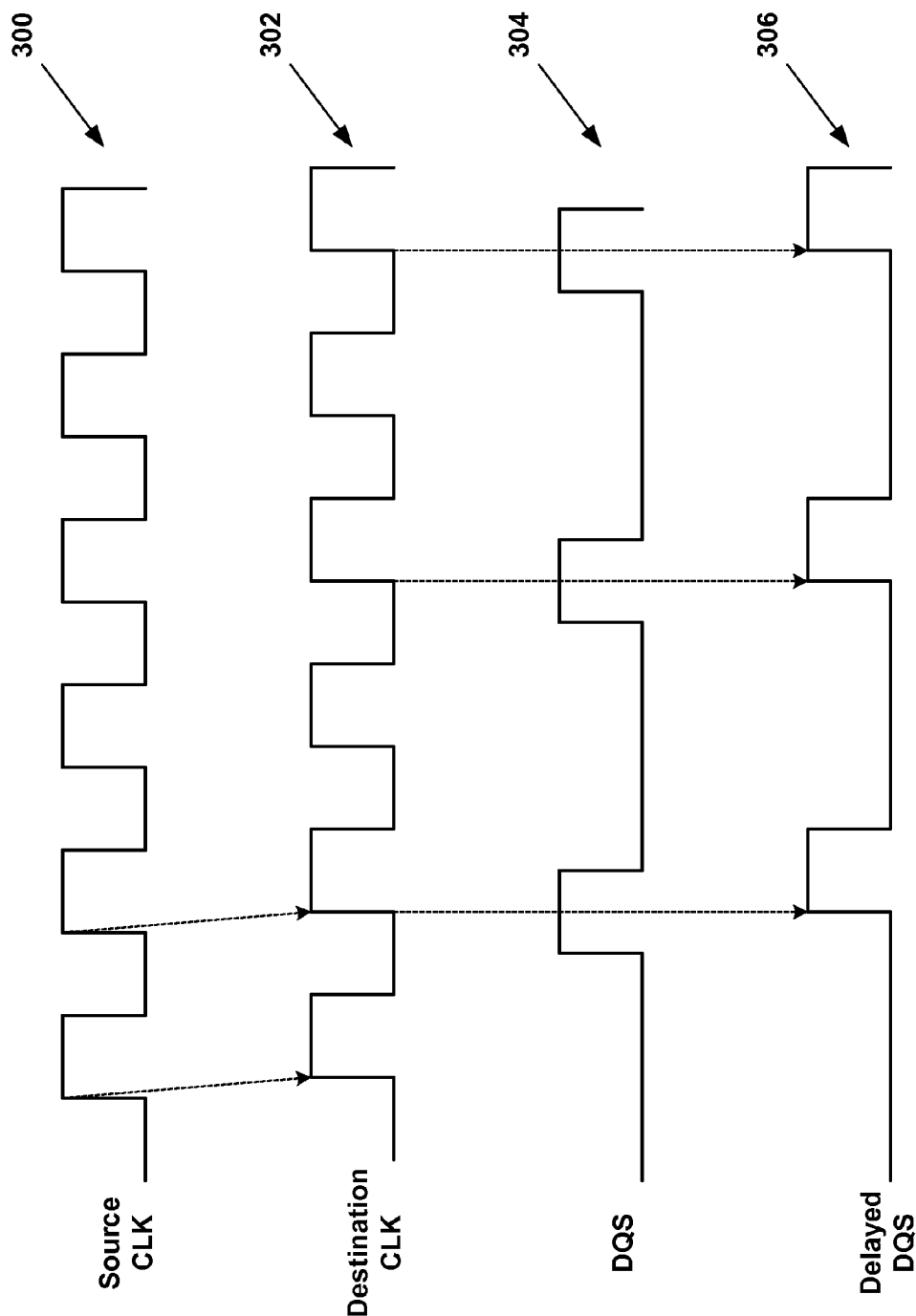
FIG. 3 is a diagram showing exemplary DQS signal correction, in accordance with an embodiment of the present invention.

FIG. 1 and FIG. 2 were described in terms of the prior art. FIG. 3 is a diagram showing exemplary DQS signal correction, in accordance with an embodiment of the present invention. In particular, FIG. 3 illustrates an exemplary source clock signal 300 and a destination clock signal 302, which illustrates the delayed clock signal 300 as it arrives at an exemplary DDR3 memory device delayed by flight time skew introduced by the fly-by topology of the DIMM. Also shown in FIG. 3, is an exemplary DQS signal 304 associated with the exemplary DDR3 memory device.

Because of the variability of the flight time skew related to each memory device, initially the DQS signal 304 is not aligned to the clock signal 300. For example, FIG. 3 illustrates an example of the affect of flight time skew on the source clock signal 300 resulting in the delayed destination clock signal 302. Here, the DQS signal 304 does not align properly with the destination clock signal 302, which is required in order to allow data on the data bus to be captured reliably at the exemplary DDR3 memory device on the DIMM. Embodiments of the present invention compensate by adding delay elements, which are predefined periods of time, to the timing of the DQS signal 304 until the DQS signal 304 aligns with the destination clock signal 302, as illustrated by the delayed DQS signal 306. Each delay element can be of any period of time having sufficient granularity such that the proper delay can be added to the DQS signal to compensate for the additional flight time skew. To determine when sufficient delay has been added to the DQS signal, embodiments of the present invention sample the destination clock signal 302 to find when the destination clock signal 302 transitions from LOW to HIGH, as illustrated next with reference to FIG. 4A and FIG. 4B.

Figure 4A:
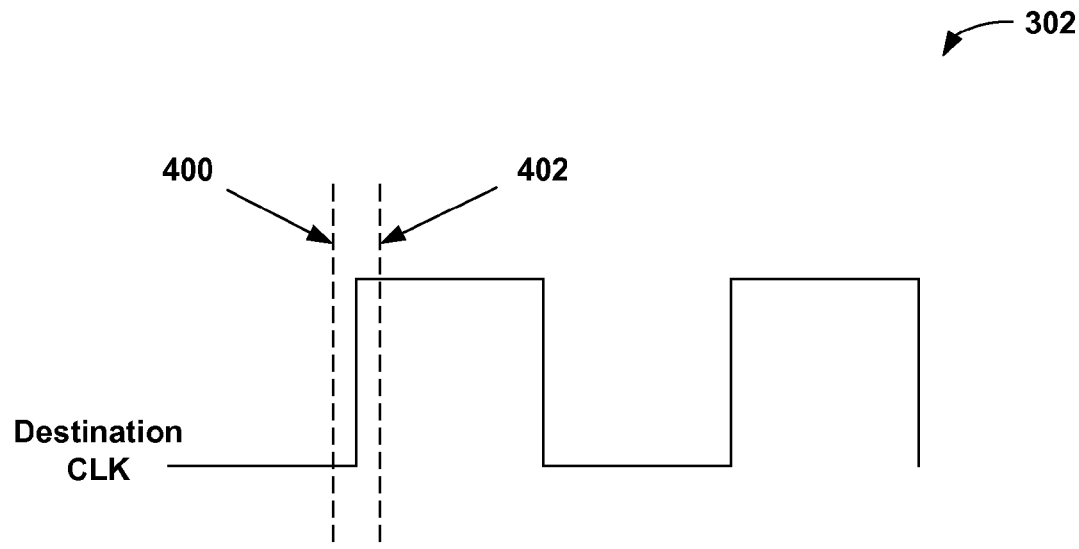
FIG. 4A is a diagram showing an exemplary destination clock signal wherein the first clock sample is performed when the destination clock signal is LOW, in accordance with an embodiment of the present invention.

FIG. 4A is a diagram showing an exemplary destination clock signal 302 wherein the first clock sample is performed when the destination clock signal is LOW, in accordance with an embodiment of the present invention. As mentioned above, embodiments of the present invention repeatedly sample the destination clock signal 302 to determine when the destination clock signal 302 transitions from a LOW to a HIGH. In the example of FIG. 4A, when the first clock sample 400 is taken, the destination clock signal is LOW. At this point, the clock sample only indicates that the destination clock signal 302 is in a LOW state and not where in the clock cycle the sample was taken. Hence, embodiments of the present invention add delay elements to delay timing of the clock sample until the clock sample indicates the destination clock signal 302 is HIGH, such as during clock sample 402. Since the destination clock signal 302 has transition from LOW to HIGH within a single delay element, the edge of the destination clock signal 302 has been found and the DQS signal can be aligned to the destination clock signal 302 edge using the calculated number of delay elements. However, additional processing may be required when the first clock sample indicates the destination clock signal 302 is in a HIGH state, as discussed next with reference to FIG. 4B.

Figure 4B:
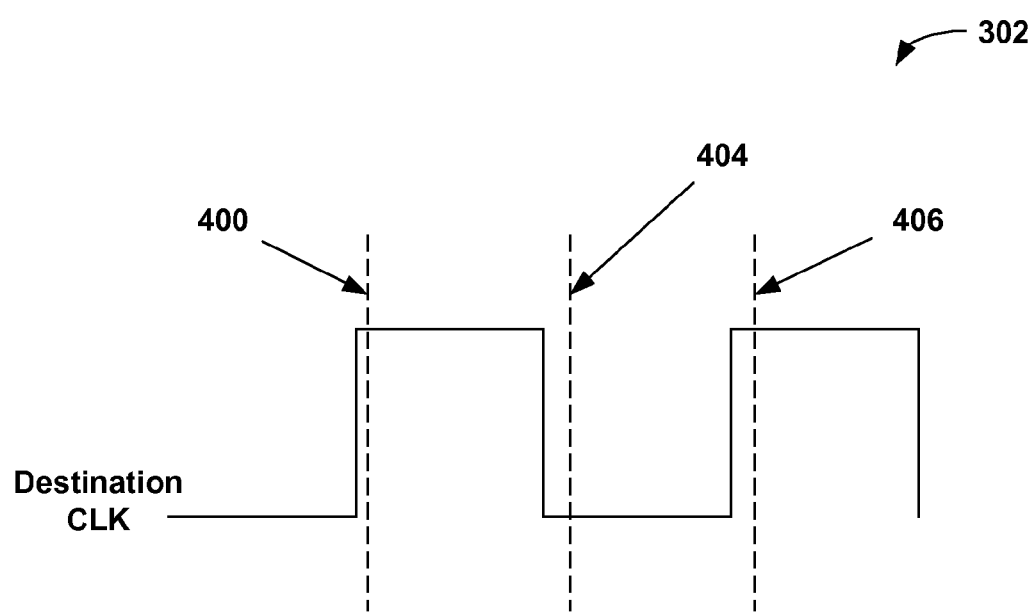
FIG. 4B is a diagram showing an exemplary destination clock signal wherein the first clock sample is performed when the destination clock signal is HIGH, in accordance with an embodiment of the present invention.

FIG. 4B is a diagram showing an exemplary destination clock signal 302 wherein the first clock sample 400 is performed when the destination clock signal is HIGH, in accordance with an embodiment of the present invention. At this point, the clock sample only indicates that the destination clock signal 302 is in a HIGH state and not where in the clock cycle the sample was taken. As above, delay elements are added to delay timing of the clock sample until the clock sample indicates the destination clock signal 302 transitions from LOW to HIGH. Since the clock sample currently indicates the destination clock signal 302 is HIGH, delay elements are added until the destination clock signal 302 transitions to LOW, such as during clock sample 404. However, as mentioned above, a transition from LOW to HIGH is needed to align the DQS signal properly. Consequently, further delay elements are added until the clock sample indicates the destination clock signal 302 is HIGH, as with clock sample 406.

Since the destination clock signal 302 has a transition from LOW to HIGH within a single delay element, the edge of the destination clock signal 302 has been found and the DQS signal could be aligned to the destination clock signal 302 edge using the calculated number of delay elements. However, in some instances such as the example of FIG. 4B, the calculated number of delay elements could result in too much delay. For example, in FIG. 4B, the first clock sample 400 was taken just after the destination clock signal 302 transitioned from LOW to HIGH. Nevertheless, this fact was unknown to the system at the time, and as a result, a full cycle of delay was calculated to align the DQS with the destination clock signal 302. However, a full cycle of delay will result in data arriving at the memory device too late. Embodiments of the present invention address this issue by performing further processing of the delay results after calculating all the delay for all the memory devices on the DIMM, as will be discussed subsequently.

Figure 5:
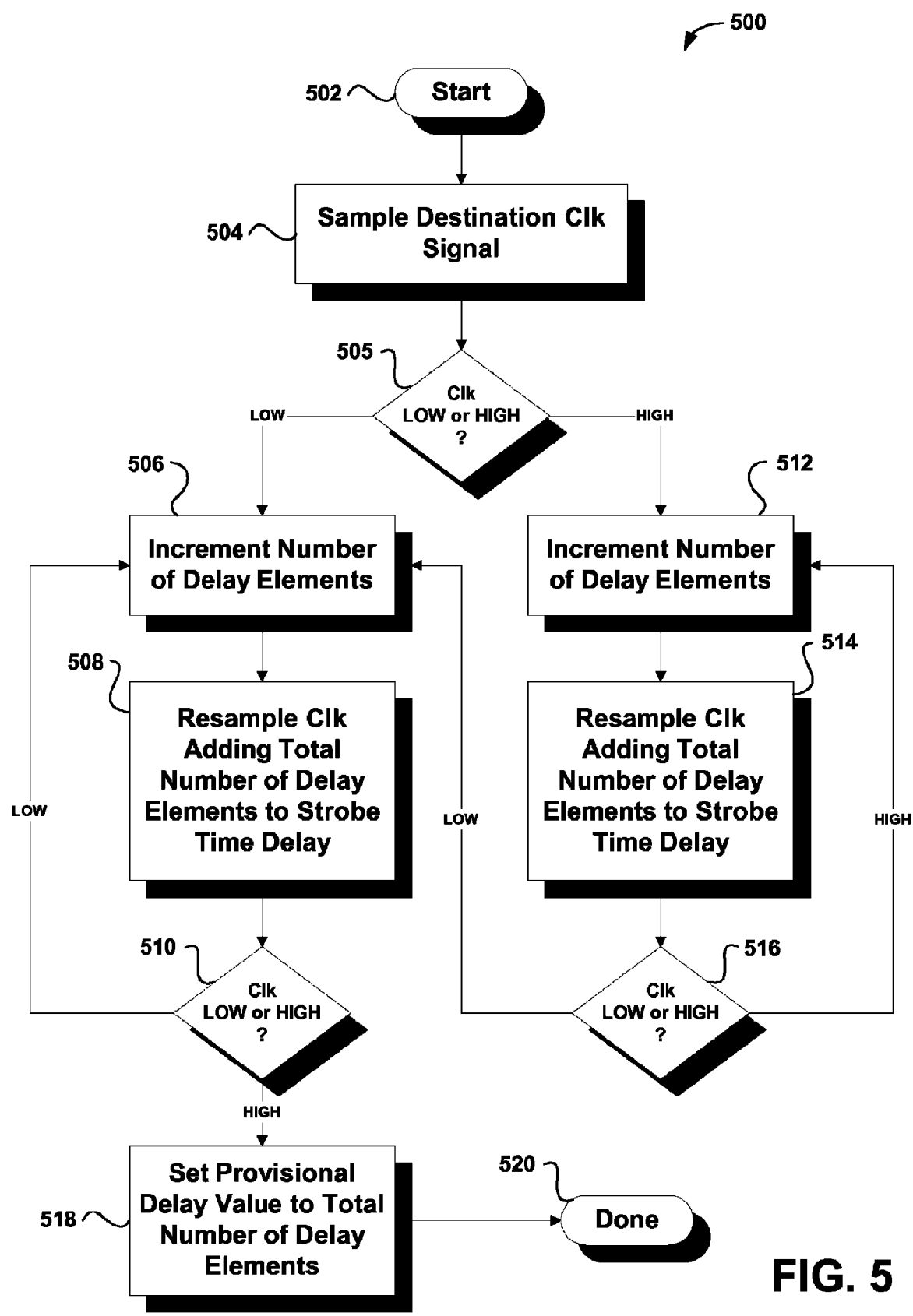
FIG. 5 is a flowchart showing a method for calculating provisional write leveling device delay, in accordance with an embodiment of the present invention.

FIG. 5 is a flowchart showing a method 500 for calculating provisional write leveling device delay, in accordance with an embodiment of the present invention. In an initial operation 502, preprocess operations are performed. Preprocess operations can include, for example, determining a length of time for each delay element, setting the DIMM to write leveling mode, and other preprocess operations that will be apparent to those skilled in the art with the hindsight afforded by a careful reading of the present disclosure.

Figure 6A:
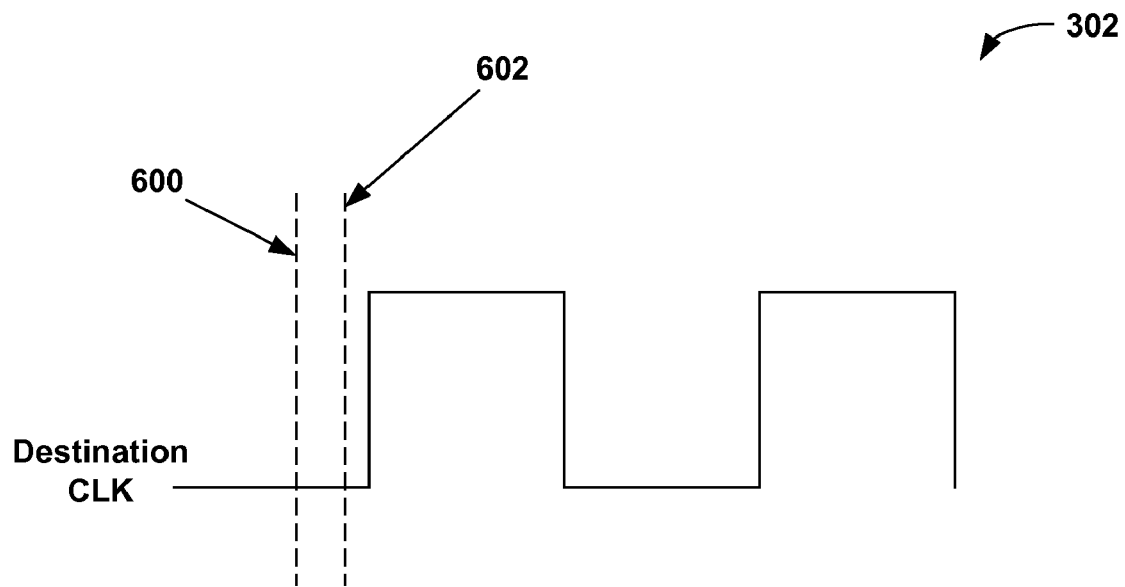
FIG. 6A is a diagram showing a destination clock signal, wherein the first clock sample is taken while the destination clock signal is LOW.
Figure 6B:
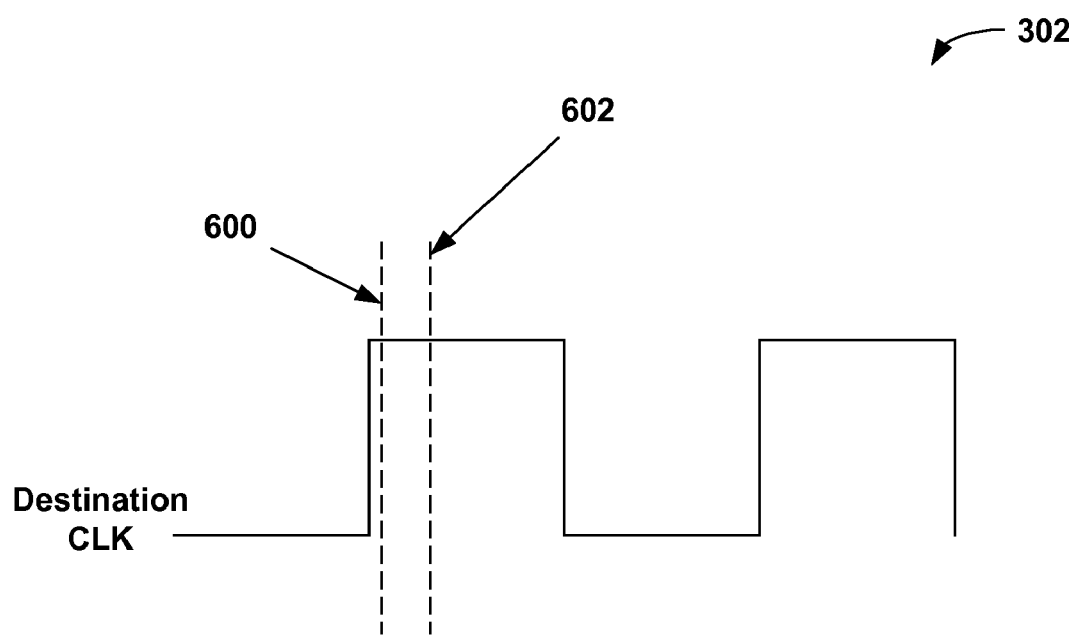
FIG. 6B is a diagram showing a destination clock signal, wherein the first clock sample is taken while the destination clock signal is HIGH.

In operation 504, the destination clock signal is sampled to determine whether the destination clock signal is LOW or HIGH. FIG. 6A is a diagram showing a destination clock signal 302, wherein the first clock sample 600 is taken while the destination clock signal 302 is LOW. FIG. 6B is a diagram showing a destination clock signal 302, wherein the first clock sample 600 is taken while the destination clock signal 302 is HIGH. In both FIGS. 6A and 6B, the clock sample only indicates whether the destination clock signal 302 is LOW or HIGH, and not where in the clock cycle the clock sample was initially taken.

Referring back to FIG. 5, a decision is made as to whether the initial clock sample indicates the destination clock signal 302 is HIGH or LOW, in operation 505. If the in initial clock sample indicates the destination clock signal 302 is LOW, the method 500 branches to operation 506, where a search for a HIGH clock signal is performed. However, if the initial clock sample indicates the destination clock signal 302 is HIGH, the method 500 branches to operation 512, where a search for a LOW signal is performed.

In operation 506, the number of delay elements is incremented in preparation for re-sampling of the destination clock signal. As indicated previously, embodiments of the present invention repeatedly sample the destination clock signal using incremental delay elements to determine where the edge of the destination clock is to compensate for the flight time skew introduced by the fly-by topology of the DIMM.

Once the number of delay elements has been incremented, the destination clock signal is re-sampled adding the total number of delay elements, which were incremented in operation 506, to the timing of the clock sample strobe, in operation 508. As illustrated in FIG. 6A, embodiments of the present invention determine where the edge of the destination clock signal 302 is located by repeatedly sampling the destination clock signal 302 with incrementally delayed clock samples. For example, after sampling the destination clock signal 302 at clock sample 600, the number of delay elements is incremented and the destination clock signal 302 is re-sampled at clock sample 602. In the example of FIG. 6A, the time difference between clock sample 600 and clock sample 602 is one delay element.

Turning back to FIG. 5, a decision is made as to whether the current clock sample indicates the destination clock 302 is currently HIGH or LOW. If the current clock sample indicates the destination clock signal 302 is LOW, the method 500 branches to another delay element increment operation 506, where the number of delay elements is incremented and the destination clock re-sampled. Otherwise, the current clock sample indicates the destination clock signal 302 is HIGH and the edge of the destination clock signal has been located. As a result, the method 500 continues to operation 518, where the provisional device delay is set.

As mentioned previously, if the initial clock sample indicates the destination clock signal 302 is HIGH, in operation 505, the method 500 branches to operation 512, where a search for a LOW signal is performed. Similar to operation 506, in operation 512 the number of delay elements is incremented in preparation for re-sampling of the destination clock signal.

Then, in operation 514, the destination clock signal is re-sampled adding the total number of delay elements, which were incremented in operation 512, to the timing of the clock sample strobe. As illustrated in FIG. 6B, embodiments of the present invention determine where the edge of the destination clock signal 302 is located by repeatedly sampling the destination clock signal 302 with incrementally delayed clock samples until a rising edge is located. For example, after sampling the destination clock signal 302 at clock sample 600, the number of delay elements is incremented and the destination clock signal 302 is re-sampled at clock sample 602. However, in the example of FIG. 6B, the initial clock sample is already HIGH. As such, embodiments of the present invention first search determine when the destination clock is LOW then search for the rising edge.

Turning back to FIG. 5, a decision is made as to whether the current clock sample indicates the destination clock 302 is currently HIGH or LOW in operation 516. If the current clock sample indicates the destination clock signal 302 is LOW, the method 500 can begin to search for the rising edge. As such, the method 500 branches to operation 506, where the number of delay elements is incremented and the destination clock is re-sampled to find the rising edge of the destination clock. However, if the current clock sample indicates the destination clock signal 302 is still HIGH, the method 500 branches to another delay element increment operation 512, where the number of delay elements is incremented and the destination clock re-sampled to find a transition to a LOW state.

The rising edge of the clock is located when the current clock sample indicates the destination clock signal is HIGH in operation 510. At this point, the provisional device delay is set equal to the total number of delay elements. The provisional device delay is a temporary value for the delay for the particular memory device that will be compared to other provisional device delays for the other memory device disposed on the DIMM to determine the final device delays for each memory device on the DIMM. As described above, the number of delay elements is incremented with each sampling of the destination clock. The provisional device delay is set equal to the total number of delay elements after the rising edge of the destination clock is found. Once the provisional device delay for the memory device is set, in operation 518, post process operations are performed in operation 520. Post process operations can include, for example, continuing with parallel clock edge searches for other memory devices on the DIMM and determining the final device delays for each memory device, as described in greater detail next with reference to FIG. 7.

Figure 7:
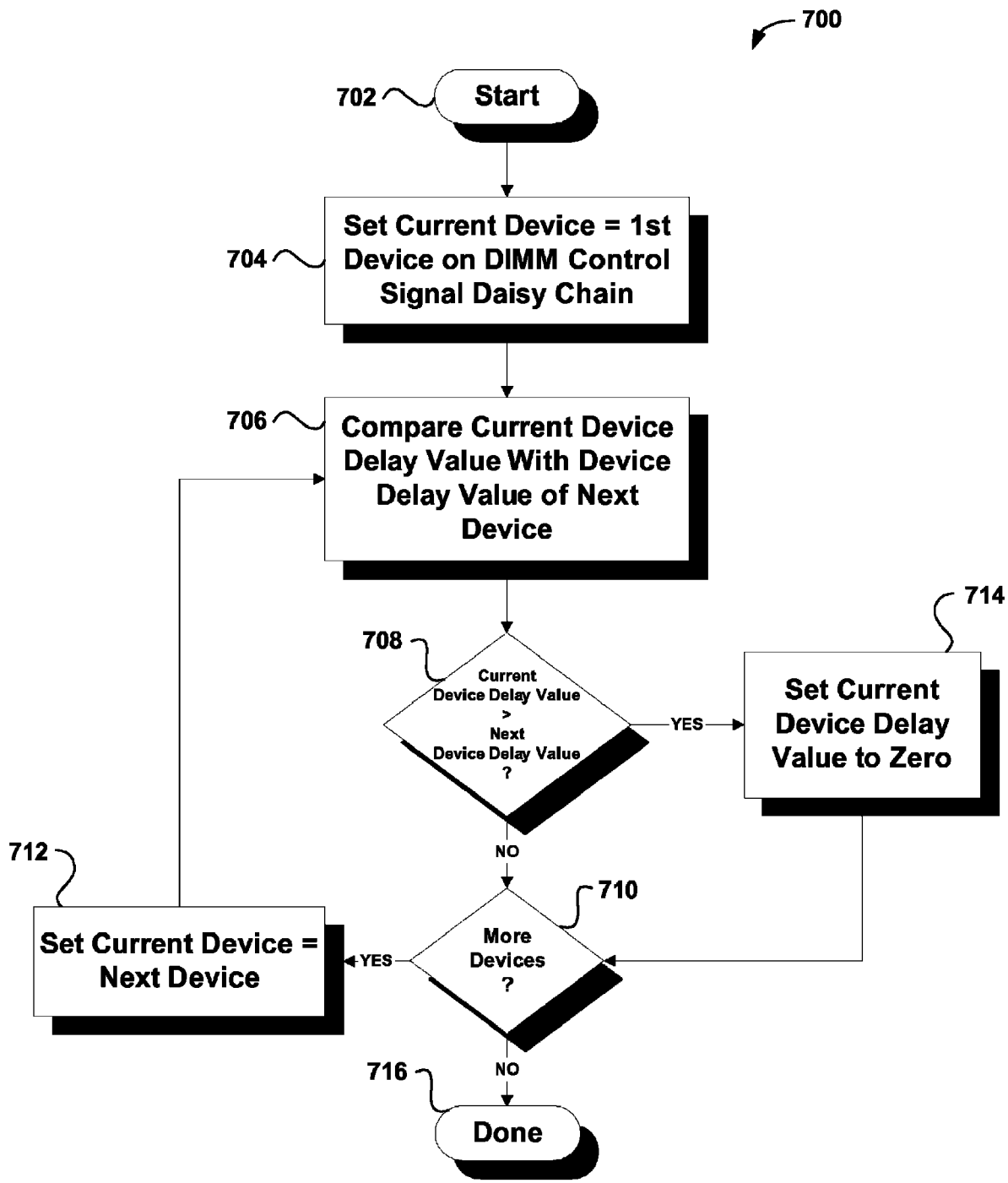
FIG. 7 is flowchart showing a method for determining the final device delay for memory devices based on the provisional device delay found using method, in accordance with an embodiment of the present invention.

FIG. 7 is flowchart showing a method 700 for determining the final device delay for memory devices based on the provisional device delay found using method 500, in accordance with an embodiment of the present invention. In an initial operation 702, preprocess operations are performed. Preprocess operations can include, for example, setting the DIMM to write leveling mode, calculating the provisional device delay for each memory device on the DIMM, and other preprocess operations that will be apparent to those skilled in the art with the hindsight afforded by a careful reading of the present disclosure.

Figure 8:
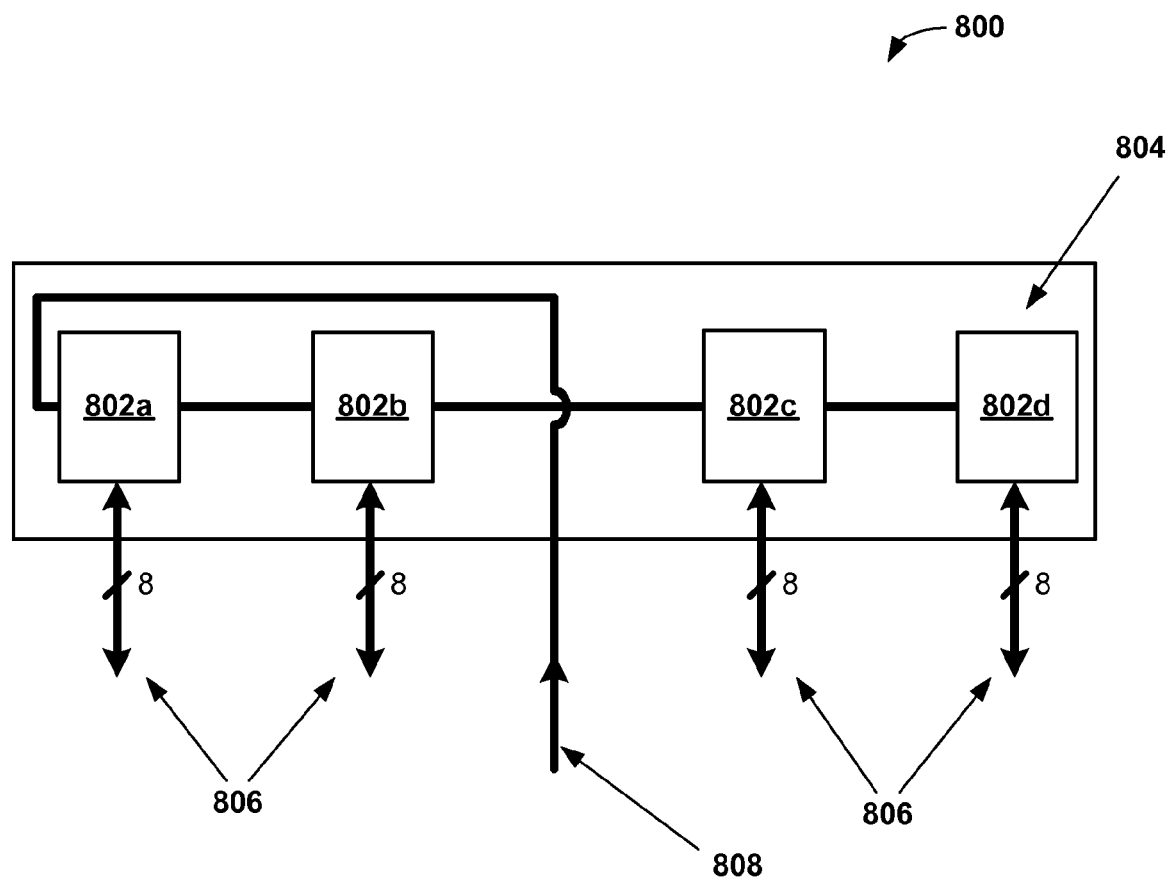
FIG. 8 is a block diagram showing a DDR3 DIMM architecture using four DDR3 SDRAM integrated circuit devices.

Typically, standard routing techniques generally result in linearly increasing delays as the clock propagates from one end of the DIMM to the other. As such, it can be expected that the device delay needed for the strobe will increase for a strobe that is farther from the "starting" end of the DIMM, that is, electrically farther from the memory device receiving the control and clock signals first. For example, FIG. 8 is a block diagram showing a DDR3 DIMM 800 architecture using four DDR3 SDRAM integrated circuit devices. As illustrated in FIG. 8, the DDR3 DIMM 800 includes a plurality of DDR3 memory devices 802a-802d disposed on a printed circuit board 804. Coupled to each DDR3 memory device 802a-802d is a set of data/DQS lines 806, which provide I/O for each DDR3 memory device 802a-802d. Also included in the DDR3 DIMM 800 are clock and command signal lines 808, which provide clock and command signals to each of the DDR3 memory devices 802a-802d.

As discussed previously, the DDR3 DIMM 800 is configured in a fly-by topology in which the clock and command signal lines 808 are connected in series to each DDR3 memory device 802a-802d on the DDR3 DIMM 800 in a daisy chain configuration. The series based connections result in slight delays in command signals between the various DDR3 memory devices on the DIMM known as flight time skew. Hence, it can be expected that the device delay needed for the strobe will increase for a strobe that is farther from the "starting" end of the DIMM, that is, electrically farther from memory 802a, which receives the control and clock signals first.

However, this may not occur when, for example, the initial clock sample when determining provisional device delay occurs just after the rising edge of the destination clock signal, wherein the calculated provisional delay may indicate a full cycle of delay as described previously with reference to FIG. 4B. In such cases, the calculated provisional device delay for the subsequent memory device may be less than the current provisional device delay because the initial clock sample for the subsequent memory device occurred just prior to the rising clock edge. Embodiments of the present invention address this issue by performing further processing of the provisional device delays as described with reference to method 700.

Turning back to FIG. 7, in operation 704, the current device is set to the first device on the DIMM control and clock signal daisy chain. Embodiments of the present invention examine the provisional device delay of each memory device in succession on the DIMM to determine if the provisional device delay should be adjusted. The memory device currently being examined is termed the "current device." Thus, in operation 704, the first device is set as the current device, and will be the first memory device to be examined. In operation 706, the provisional device delay value for the current device is compared to the provisional device delay value of the next device on the DIMM control and clock signal daisy chain. Referring to FIG. 8, for example, the provisional device delay value for memory device 802a is compared to the provisional device delay value for memory device 802b, which is the next device on control and clock signal daisy chain 808 for the DIMM 800.

Turing back to FIG. 7, a decision is made as to whether the provisional device delay value for the current device is greater than the provisional device delay value for the next device on the DIMM control and clock signal daisy chain, in operation 708. If the provisional device delay value for the current device is greater than the provisional device delay value for the next device on the DIMM control and clock signal daisy chain, the method 700 branches to operation 714, where the provisional device delay value for the current device is adjusted. Otherwise, the method 700 continues to operation 710, where a check is made to determine if additional memory devices need to be examined.

Figure 9:
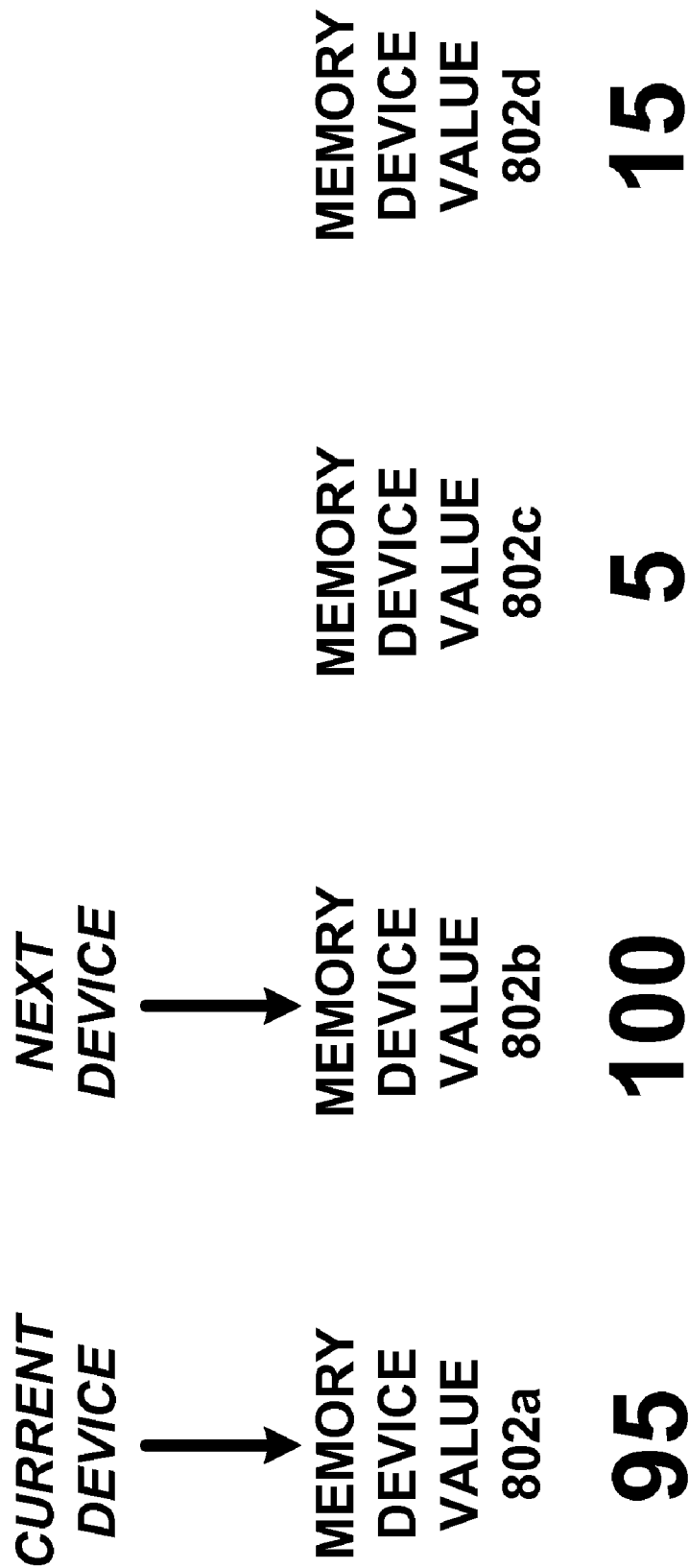
FIG. 9 is a chart showing exemplary provisional device delay values for exemplary memory devices of FIG. 8 wherein the current device is set to the first memory device, in accordance with an embodiment of the present invention.

When the provisional device delay value for the current device is less than or equal to the provisional device delay value for the next device on the DIMM control and clock signal daisy chain, a decision is made as to whether more devices after the next device remain to be examined, in operation 710. For example, FIG. 9 is a chart showing exemplary provisional device delay values for exemplary memory devices of FIG. 8 wherein the current device is set to memory device 802a, in accordance with an embodiment of the present invention. As illustrated in FIG. 9, memory device 802a is set to the current device and thus, memory device 802b is the next device on the control and clock signal daisy chain. In this example, the provisional device delay value of memory device 802a was calculated to be 95 delay elements, while the provisional device delay value of memory device 802b was calculated to be 100 delay elements. Since the value of the provisional device delay of memory device 802a is not greater than the provisional device delay value of memory device 802b, the system determines whether more devices exist to be examined after the next device, which in this case is memory device 802b.

Turning back to FIG. 7, if more devices remain to be examined after the next device, the method 700 branches to operation 712, where the next device becomes the current device to be examined. For example, in FIG. 9 both memory devices 802c and memory devices 802d remain to be examined, hence, the method 700 branches to operation 712. Otherwise, i.e., when the next device is the last device on the control and clock signal daisy chain, the method ends with operation 716.

When more devices remain to be examined after the next device, the current device is set to the next device, in operation 712. The current device, now the next device, is then compared to the next device in another comparison operation 706. For example, referring to FIG. 9, the next device 802b is set to the current device in operation 706.

Figure 10A:
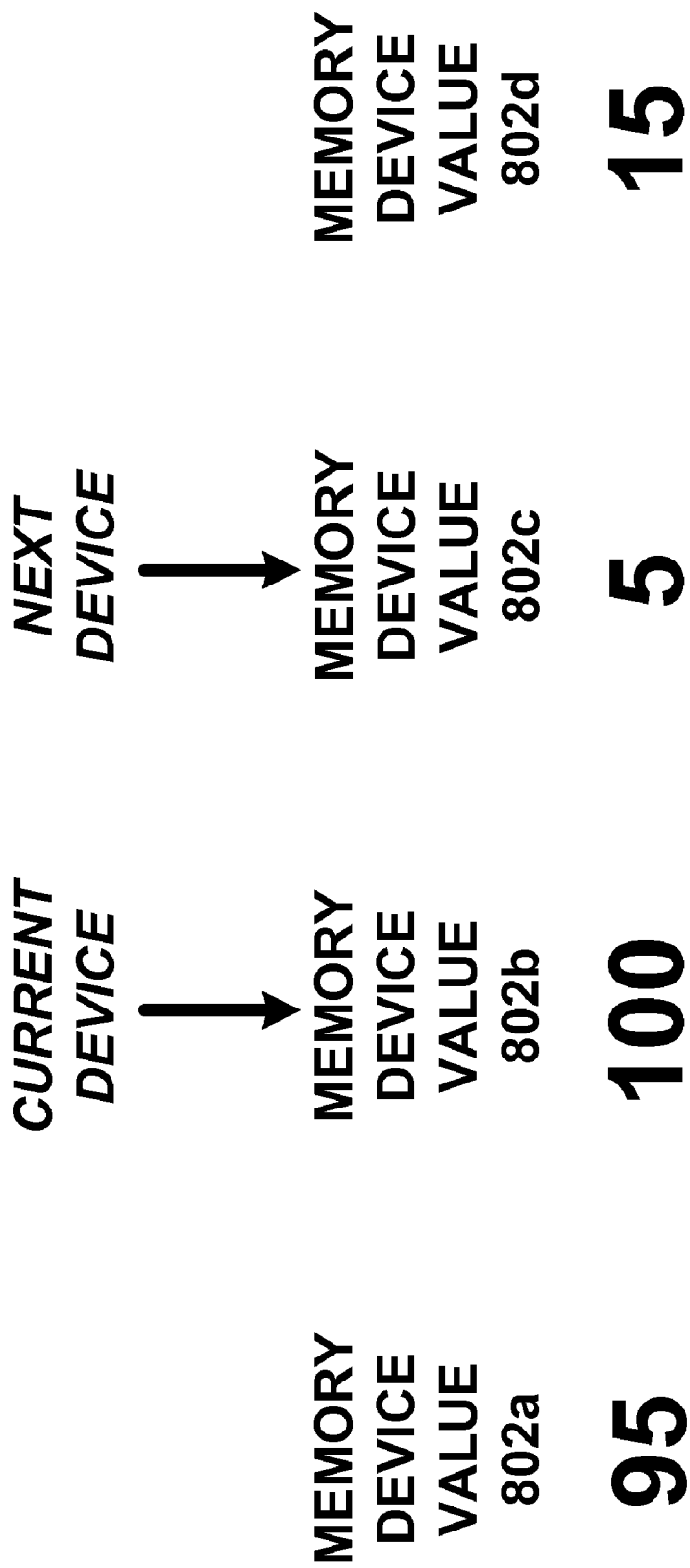
FIG. 10A is a chart showing exemplary provisional device delay values for exemplary memory devices of FIG. 8 wherein the current device is set to the second memory device, in accordance with an embodiment of the present invention.
Figure 10B:
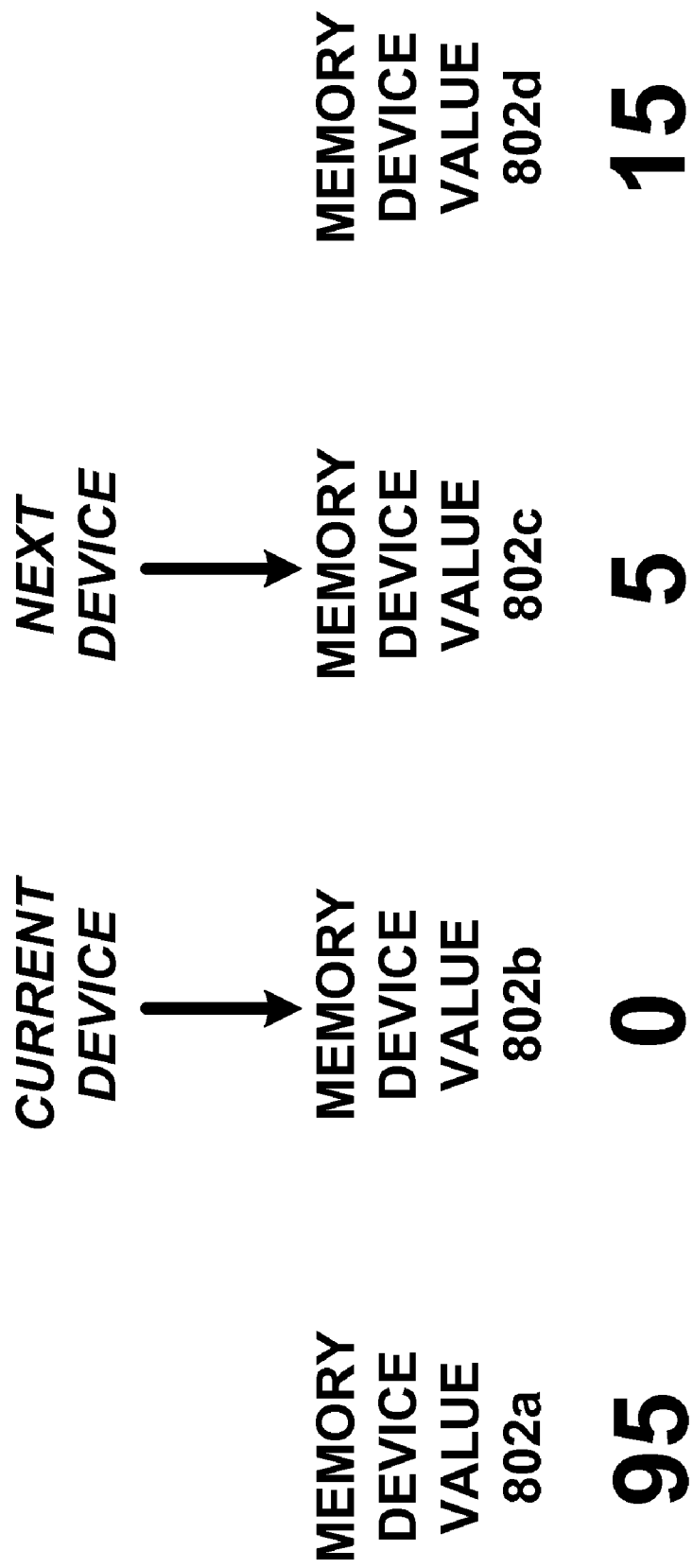
FIG. 10B is a chart showing exemplary provisional device delay values for exemplary memory devices of FIG. 8 wherein the provisional device delay value for the second memory device is set to zero, in accordance with an embodiment of the present invention.

Referring back to FIG. 7, when the provisional device delay value for the current device is greater than the provisional device delay value for the next device on the DIMM control and clock signal daisy chain, the value of the provisional device delay for the current device is set to zero, in operation 714. FIG. 10A is a chart showing exemplary provisional device delay values for exemplary memory devices of FIG. 8 wherein the current device is set to memory device 802b, in accordance with an embodiment of the present invention. In the example, of FIG. 10A, the memory device 802b is set to the current device and thus, memory device 802c is the next device on the control and clock signal daisy chain. In this example, the provisional device delay value of memory device 802b was calculated to be 100 delay elements, and the provisional device delay value of memory device 802c was calculated to be 5 delay elements. Since the value of the provisional device delay of memory device 802b is greater than the provisional device delay value of memory device 802c, embodiments of the present invention can determine that the initial clock sample for memory device 802b was initially very close to, but just after, the rising edge of the destination clock signal. Thus, the value of the provisional device delay of memory devices 802a and 802b are set to zero since the timing for memory device 802a and 802b were initially correct, or close to correct, and did not require adjustment for flight time skew, as illustrated in FIG. 10B.

Referring back to FIG. 7, the current values of the provisional device delays for all memory devices become the final device delay values and post process operations are performed in operation 716. Once all the provisional device delay values have been examined and adjusted if needed, the provisional device delay values become the final device delay values that will be utilized for each memory device on the DIMM. Remaining post process operation can include, for example, setting the DIMM to normal operation mode, providing read/write signals to the DIMM, and other post process operations that will be apparent to those skilled in the art with the hindsight afforded by a careful reading of the present disclosure.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for determining write leveling delay for a plurality of memory devices having command signal lines connected in series to each memory device, comprising the operations of:
    determining a device delay value for each memory device, wherein each device delay value indicates a period of time to delay a control signal that is unique to an associated memory device when accessing the associated memory device; and
    setting a prior device delay value to a lower value when a subsequent device delay value of a memory device connected subsequently along the command signal lines is greater than the prior device delay value.

2. A method as recited in claim 1, wherein each device delay value indicates a number of delay elements, each delay element being a predefined period of time.

3. A method as recited in claim 1, wherein the prior device delay values are set to zero when the subsequent device delay value is greater than the prior device delay value.

4. A method as recited in claim 1, wherein the control signal is a data strobe (DQS) signal.

5. A method as recited in claim 1, wherein the device delay values are determined by repeatedly sampling a clock signal and comparing the clock signal to the control signal.

6. A method as recited in claim 5, wherein the device delay value indicates a number of delay elements, each delay element being a predefined period of time, and wherein the number of delay elements is incremented each time the clock signal is sampled.

7. A method as recited in claim 5, wherein the clock signal is sampled until an approximate rising edge of the clock signal is located.

8. A method for determining write leveling delay for a plurality of memory devices having command signal lines connected in series to each memory device, comprising the operations of:
    determining a device delay value for each memory device, each device delay value indicating a period of time to delay a control signal that is unique to an associated memory device when accessing a related memory device;
    comparing a first device delay value associated with a first memory device to a second device delay value associated with a second memory device, the second memory device connected in series after the first memory device; and
    setting the first device delay value to a lower value when the first delay value is greater than the second device delay value.

9. A method as recited in claim 8, further comprising the operation of allowing the first device delay value to remain unchanged when the first device delay value is less than the second device delay value.

10. A method as recited in claim 8, wherein the first device delay value is set to zero when the first delay value is greater than the second device delay value.

11. A method as recited in claim 8, further comprising the operations of:
    comparing the second device delay value associated with the second memory device to a third device delay value associated with a third memory device, the third memory device connected in series after the second memory device; and
    setting the second device delay value to a lower value when the second device delay value is greater than the third device delay value.

12. A method as recited in claim 8, wherein each device delay value indicates a number of delay elements, each delay element being a predefined period of time.

13. A method as recited in claim 8, wherein each memory device is a Double data rate three (DDR3) synchronous dynamic random access memory device.

14. A method as recited in claim 13, wherein each memory device is disposed on a memory module.

15. A method as recited in claim 14, wherein the memory module is a dual in-line memory module (DIMM).

16. A memory controller capable of performing write leveling operations, comprising:
    a plurality of control lines, each capable of being configured to access a memory device via a control signal;
    a plurality of command signal lines capable of being placed in serial communication with each memory device;
    logic that determines a device delay value for each memory device, wherein each device delay value indicates a period of time to delay a control signal that is unique to an associated memory device when accessing the associated memory device; and
    logic that sets a prior device delay value to a lower value when a subsequent device delay value of a memory device connected subsequently along the command signal lines is greater than the prior device delay value.

17. A memory controller as recited in claim 16, wherein each device delay value indicates a number of delay elements, each delay element being a predefined period of time.

18. A method as recited in claim 16, wherein the prior device delay value is set to zero when the subsequent device delay value is greater than the prior device delay value.

19. A method as recited in claim 16, wherein each device delay value is compared to a subsequent device delay value only once.

20. A method as recited in claim 16, wherein the device delay values are determined by repeatedly sampling a clock signal and comparing the clock signal to the control signal.

* * * * *